United States Patent
Buford

(10) Patent No.: US 9,531,042 B2
(45) Date of Patent: Dec. 27, 2016

(54) BATTERY TARGET TEMPERATURE METHODS AND SYSTEMS

(71) Applicant: GM GLOBAL TECHNOLOGY OPERATIONS LLC, Detroit, MI (US)

(72) Inventor: Keith D. Buford, Southfield, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 618 days.

(21) Appl. No.: 13/751,958

(22) Filed: Jan. 28, 2013

(65) Prior Publication Data

US 2014/0210481 A1    Jul. 31, 2014

(51) Int. Cl.
| | | |
|---|---|---|
| *H01M 10/625* | (2014.01) | |
| *H01M 10/63* | (2014.01) | |
| *G01R 31/36* | (2006.01) | |
| *H01M 10/48* | (2006.01) | |

(52) U.S. Cl.
CPC ...... *H01M 10/5016* (2013.01); *G01R 31/3606* (2013.01); *H01M 10/486* (2013.01); *H01M 10/625* (2015.04); *H01M 10/63* (2015.04)

(58) Field of Classification Search
CPC .................................................. H01M 10/625
USPC .......................................................... 324/431
See application file for complete search history.

(56) References Cited

U.S. PATENT DOCUMENTS

| | | | |
|---|---|---|---|
| 6,408,968 B1* | 6/2002 | Wakashiro et al. | 180/65.26 |
| 8,981,782 B2* | 3/2015 | Henkel et al. | 324/431 |
| 2003/0094321 A1* | 5/2003 | Hirata | B60L 11/1851 180/65.245 |
| 2008/0292945 A1* | 11/2008 | Kumar et al. | 429/52 |
| 2009/0020346 A1* | 1/2009 | Krauer et al. | 180/65.2 |
| 2010/0258063 A1* | 10/2010 | Thompson | 123/41.19 |
| 2011/0148424 A1* | 6/2011 | Chiang et al. | 324/427 |
| 2011/0229749 A1* | 9/2011 | Kim et al. | 429/120 |
| 2012/0003516 A1* | 1/2012 | Eisenhour | 429/62 |
| 2012/0316712 A1* | 12/2012 | Simonini et al. | 701/22 |

FOREIGN PATENT DOCUMENTS

| | | |
|---|---|---|
| CN | 102540089 A | 7/2012 |
| CN | 102815222 A | 12/2012 |

OTHER PUBLICATIONS

CN102815222A—Machine Translation of Application, Sep. 8, 2016.
CN102540089A—Machine Translation of Application.

\* cited by examiner

*Primary Examiner* — Drew A Dunn
*Assistant Examiner* — Jerry D Robbins
(74) *Attorney, Agent, or Firm* — Phillips Ryther & Winchester; Matthew D. Thayne

(57) ABSTRACT

Methods and systems for determining a target temperature and/or adjusting a temperature associated with a battery, such as a vehicle battery. In some implementations of such methods, a temperature-scaled battery capacity of at least a portion of a battery may be determined at a measured temperature. The temperature-scaled battery capacity may be compared with a capacity threshold and, upon determining that the temperature-scaled battery capacity is below the capacity threshold, a target battery temperature for the at least a portion of the battery may be determined and/or set.

10 Claims, 3 Drawing Sheets

BATTERY TARGET TEMPERATURE METHODS AND SYSTEMS

TECHNICAL FIELD

This disclosure relates to methods and systems for determining a target temperature and/or adjusting a temperature associated with a battery. For example, in some embodiments, this disclosure relates to methods and systems for determining a target temperature for a rechargeable energy storage system ("RESS") and/or adjusting an RESS temperature to improve vehicle efficiency.

BACKGROUND

The range of an electric vehicle is typically proportional to the battery capacity and, as a result, may vary greatly due to fluctuations in the temperature of the battery. As such, customers in certain geographic areas that experience cold temperatures and/or large temperature swings could potentially experience a wide variety of electric vehicle performance, such as electric vehicle ranges. For example, an identical trip in a particular region using a vehicle with an RESS could vary substantially in terms of range and/or depletion of battery charge on different occasions depending on ambient temperature. Temperature effects may also further manifest in terms of battery state of health. For example, major fluctuations in temperature may result in accelerated RESS aging.

The present inventors have therefore determined that it would be desirable to provide methods and systems for determining optimal battery target temperatures and/or adjusting such battery temperatures in order to overcome one or more of the foregoing limitations and/or other limitations of the prior art.

SUMMARY

Methods and systems are disclosed herein for determining a target temperature and/or adjusting a temperature associated with a battery. Some embodiments and implementations may be particularly useful in connection with rechargeable energy storage systems ("RESS") for electric vehicles. In some embodiments, a temperature-scaled capacity relationship may be to determine a target temperature of the battery, or at least a portion of the battery. Some embodiments may also use state of health information in determining the target temperature.

Some embodiments and implementations may comprise calculating and/or balancing the costs of conditioning a battery, such as an RESS, and further calculating the potential gain in capacity and/or electric vehicle range based on the current temperature versus the proposed target temperature.

Some embodiments and implementations may be configured to determine and/or set a target battery temperature that is within predetermined percentage of the maximum rated capacity of the battery. As mentioned above, some embodiments may be further configured to utilize battery state of health information in order to determine the capacity of the battery and/or determine a target battery temperature. Some embodiments may be configured to maximize the consistency of an electric vehicle range in a variety of climates and/or temperatures. Some embodiments may be configured to determine an RESS target temperature using RESS capacity, current temperature, ambient temperature, and/or state of health information.

In one specific example of a method for determining a target battery temperature, a state of health of at least a portion of a battery may be determined. A measured temperature associated with the at least a portion of the battery may then be received from, for example, a temperature sensor associated with the battery. A temperature-scaled battery capacity of the at least a portion of the battery at the measured temperature may then be determined, after which the temperature-scaled battery capacity may be compared with a capacity threshold. The capacity threshold may be, for example, 90% of the total capacity of the battery.

Upon determining that the temperature-scaled battery capacity is below the capacity threshold, a target battery temperature for the at least a portion of the battery may be determined. In some implementations, the temperature battery capacity may also be set, which may result in the initiation of a conditioning program to alter the battery temperature.

In some implementations, the battery may comprise a rechargeable energy storage system, such as a rechargeable energy storage system for an extended-electric vehicle. Some implementations may further comprise setting the target battery temperature for the at least a portion of the battery.

Some implementations may comprise calculating a conditioning energy comprising an estimate of the energy needed to recondition the at least a portion of the battery to the target battery temperature and/or calculating an efficiency energy comprising an estimate of the energy savings attributable to operating the battery at the target battery temperature in comparison to operating the battery at the measured temperature. In some such implementations, the conditioning energy may be compared with the efficiency energy and, upon determining that the efficiency energy exceeds the conditioning energy, the target battery temperature may be set.

In some implementations, determining that the efficiency energy exceeds the conditioning energy may comprise determining that a ratio of the efficiency energy to the conditioning energy exceeds a threshold ratio.

Some implementations may further comprise reconditioning the at least a portion of the battery to the target battery temperature after setting the target battery temperature. The target battery temperature may, in some embodiments and implementations, comprise a temperature range.

In another specific example of an implementation of a method for modifying a vehicle battery temperature, the method may comprise determining a state of health of at least a portion of a vehicle battery and receiving a measured temperature associated with the at least a portion of the vehicle battery. The method may further comprise calculating a temperature-scaled battery capacity of the at least a portion of the vehicle battery at the measured temperature and at the determined state of health of the vehicle battery, comparing the temperature-scaled battery capacity with a capacity threshold and, upon determining that the temperature-scaled battery capacity is below the capacity threshold, determining and/or setting a target battery temperature for the at least a portion of the vehicle battery.

A conditioning energy may also be calculated, along with an efficiency energy, wherein the conditioning energy comprises an estimate of the energy needed to recondition the at least a portion of the vehicle battery to the target battery temperature and the efficiency energy comprises an estimate of the energy savings attributable to operating the vehicle at the target battery temperature in comparison to operating the vehicle at the measured temperature. Some implementations may comprise comparing the conditioning energy with the efficiency energy and, upon determining that a ratio of the efficiency energy to the conditioning energy exceeds a threshold ratio, setting the target battery temperature to recondition the at least a portion of the vehicle battery to the target battery temperature.

In one specific example of a system for modifying a vehicle battery temperature, the system may comprise a vehicle battery system comprising at least one vehicle battery, a battery temperature sensor configured to sense a temperature of at least a portion of the vehicle battery system, and a battery conditioning system configured to receive information from the battery temperature sensor and modify a temperature of the at least a portion of the vehicle battery system. The battery conditioning system may be configured to calculate a temperature-scaled battery capacity of the at least a portion of the battery at the sensed temperature and to compare the temperature-scaled battery capacity with a capacity threshold. Upon determining that the temperature-scaled battery capacity is below the capacity threshold, the battery conditioning system may be configured to determine a target battery temperature for the at least a portion of the battery.

Some embodiments may comprise at least one sensor communicatively coupled to the battery conditioning system, wherein the at least one sensor is configured to obtain data used to determine a state of health of the vehicle battery. The battery conditioning system may be configured to use the state of health of the vehicle battery to calculate the temperature-scaled battery capacity. The battery conditioning system may be further configured to calculate a conditioning energy comprising an estimate of the energy needed to recondition the at least a portion of the vehicle battery to the target battery temperature.

Some embodiments may further comprise an ambient temperature sensor configured to sense an ambient temperature associated with the vehicle. The battery conditioning system may be configured to calculate the conditioning energy using one or more of the ambient temperature, a current temperature of at least a portion of the vehicle battery system sensed from the battery temperature sensor, and the target battery temperature. The battery conditioning system may be further configured to calculate an efficiency energy comprising an estimate of the energy savings attributable to operating the vehicle at the target battery temperature in comparison to operating the vehicle at the sensed temperature. The efficiency energy may be calculated using at least an estimated change in a battery capacity of the at least one vehicle battery between the sensed battery temperature and the target battery temperature.

In some embodiments, the battery conditioning system may be further configured to compare the conditioning energy with the efficiency energy and, upon determining that the efficiency energy exceeds the conditioning energy, set the target battery temperature to recondition the at least a portion of the vehicle battery to the target battery temperature. In some embodiments, the battery conditioning system may be configured to compare the conditioning energy with the efficiency energy and, upon determining that a ratio of the efficiency energy to the conditioning energy exceeds a threshold ratio, set the target battery temperature to recondition the at least a portion of the vehicle battery to the target battery temperature.

Some embodiments may comprise a battery heating system communicatively coupled with the battery conditioning system and configured to modify a temperature of at least a portion of the vehicle battery. In some embodiments, the battery heating system may comprise a heat transfer fluid, a pump configured to pump the heat transfer fluid through the vehicle battery system, and a heater configured to heat the heat transfer fluid.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

A detailed description of systems and methods consistent with various embodiments of the present disclosure is provided below. While several embodiments are described, it should be understood that disclosure is not limited to any of the specific embodiments disclosed, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts may be designated by like numerals. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Embodiments of the systems and methods disclosed herein may be used to determine a desired target temperature and/or adjust a temperature associated with a battery. Some embodiments disclosed herein may be particularly useful for rechargeable energy storage systems ("RESS"), such as are commonly used within an extended-range electric vehicle ("EREV"). More specific embodiments and implementations will now be described in greater detail with reference to the accompanying drawings.

Figure 1:
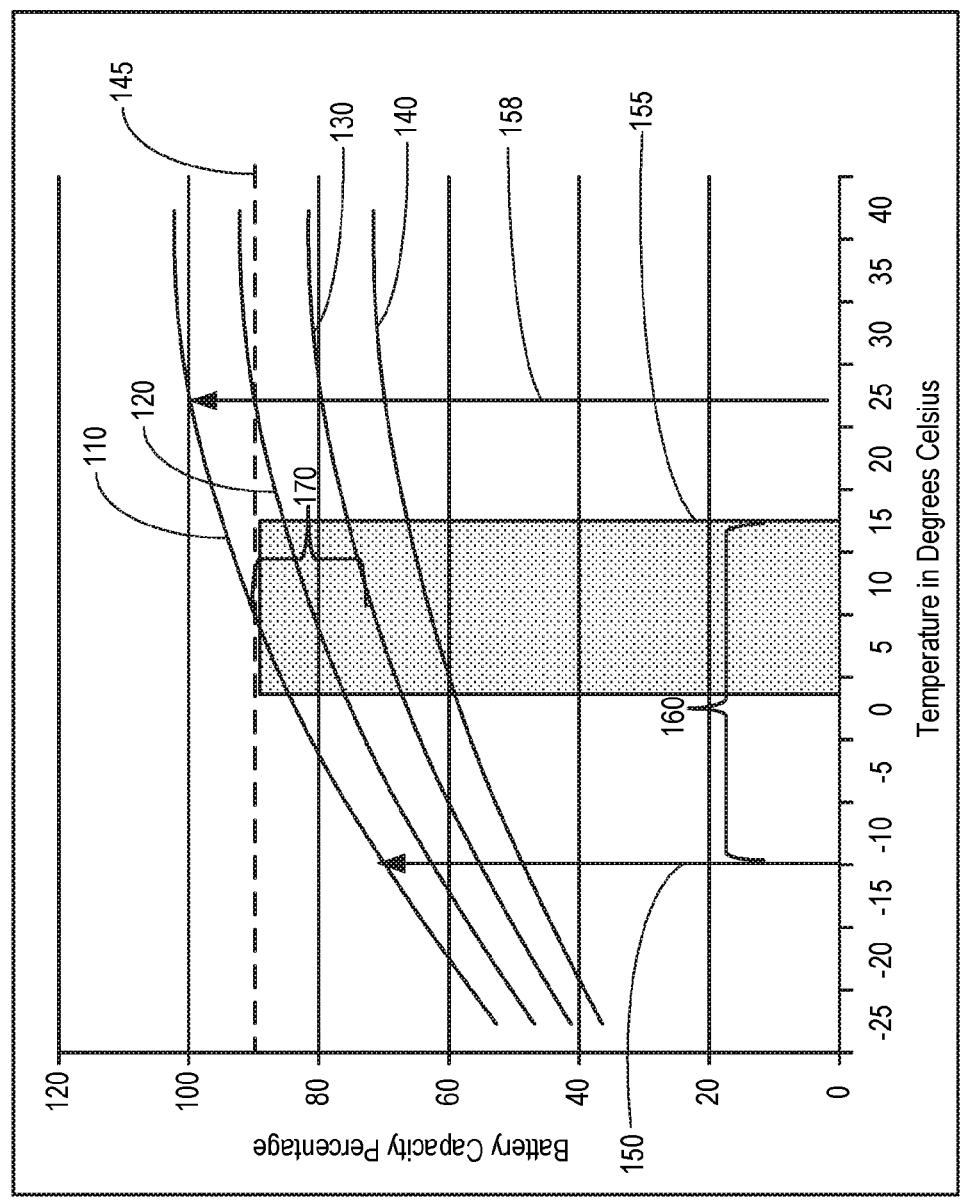
FIG. 1 illustrates a graph showing an example of how the capacity and/or performance of a battery may vary according to its temperature.

FIG. 1 is a graph illustrating an example of how the capacity and/or performance of a battery may vary according to its temperature. As shown in this graph, the performance of a battery (due to increased battery capacity), such as a vehicle battery, may vary in accordance with its temperature. Similarly, as shown in the graph of FIG. 1, the capacity of a battery may vary according to the age or state of health of the battery.

Temperature in degrees Celsius is plotted along the "X" axis of FIG. 1 at 100. Capacity as a percentage of total capacity is plotted along the "Y" axis of FIG. 1 at 102. Line 110 corresponds with a new, or relatively new, vehicle battery, line 120 corresponds with vehicle battery in year four, line 130 corresponds with a vehicle battery in year seven, and line 140 corresponds with a vehicle battery in year ten. As can be seen by comparing these lines, battery capacity (and thus battery performance) tends to degrade over time.

Thus, at the temperature indicated at line 150, the capacity (and performance) of each of the batteries 110-140 is substantially below that of those batteries at the temperature indicated at line 158. Although it may not be efficient for some embodiments to attempt to recondition one or more portions of a battery to reach an ideal temperature, such as the temperature indicated at 158, it may be feasible, or at least more efficient, to increase such temperature(s) less dramatically, such as, for example, somewhere within the range of temperatures shown in the temperature range 155.

A temperature increase of a current temperature 150 to a possible target temperature at an upper end of range 155 is therefore shown at 160. An increase of the capacity of the battery of line 110 from a current temperature 150 to an average of temperature range 155 is shown at 170. As illustrated in the chart, increasing the battery temperature as shown at 160 results in a significant increase in capacity and performance, as indicated at 170.

As also indicated in the chart, batteries having other states of health—i.e., batteries indicated by lines 120-140—would be expected to exhibit a similar increase in capacity/performance attributable to increasing the temperature of the battery from a current temperature 150 to an average of temperature range 155 (or somewhere else within temperature range 155).

An embodiment of a system according to the disclosure provided herein may therefore be configured to determine an appropriate target temperature and/or temperature range for reconditioning one or more portions of a vehicle battery. Such systems may further be configured to set the target temperature and/or temperature range to cause the system to recondition the battery temperature(s) accordingly. Some embodiments and implementations may be configured to determine and/or set such target temperature(s) upon determining that a battery capacity has fallen below a particular threshold, such as capacity threshold 145, as shown in FIG. 1.

Such threshold(s) may vary in accordance with the age and/or state of health of the battery and/or battery section. For example, threshold 145 may be specific to a new or relatively new battery, such as the battery referenced in line 110. Thresholds for older batteries or older battery sections may be lower and may vary according to their respective states of health. In other embodiments, such threshold(s) may not vary according to states of health. In other words, in some embodiments, capacity threshold 145 may be identical for all batteries and/or battery sections, irrespective of their states of health.

Some embodiments and implementations may be configured to use one or more additional parameters in determining whether to determine and/or set a target temperature. For example, some embodiments and implementations may be configured to calculate a conditioning energy comprising an estimate of the energy needed to recondition the at least a portion of the vehicle battery to the target battery temperature and/or an efficiency energy comprising an estimate of the energy savings attributable to operating the vehicle at the target battery temperature in comparison to operating the vehicle at the sensed temperature. Such embodiments and implementations may be configured to compare the conditioning energy with the efficiency energy and, upon determining that the efficiency energy exceeds the conditioning energy, set the target battery temperature to recondition the at least a portion of the vehicle battery to the target battery temperature. In some embodiments and implementations, determining that the efficiency energy exceeds the conditioning energy may comprise determining that a ratio of the efficiency energy to the conditioning energy exceeds a threshold ratio. This threshold ratio may, for example, be about 2/1 in some embodiments.

Figure 2:
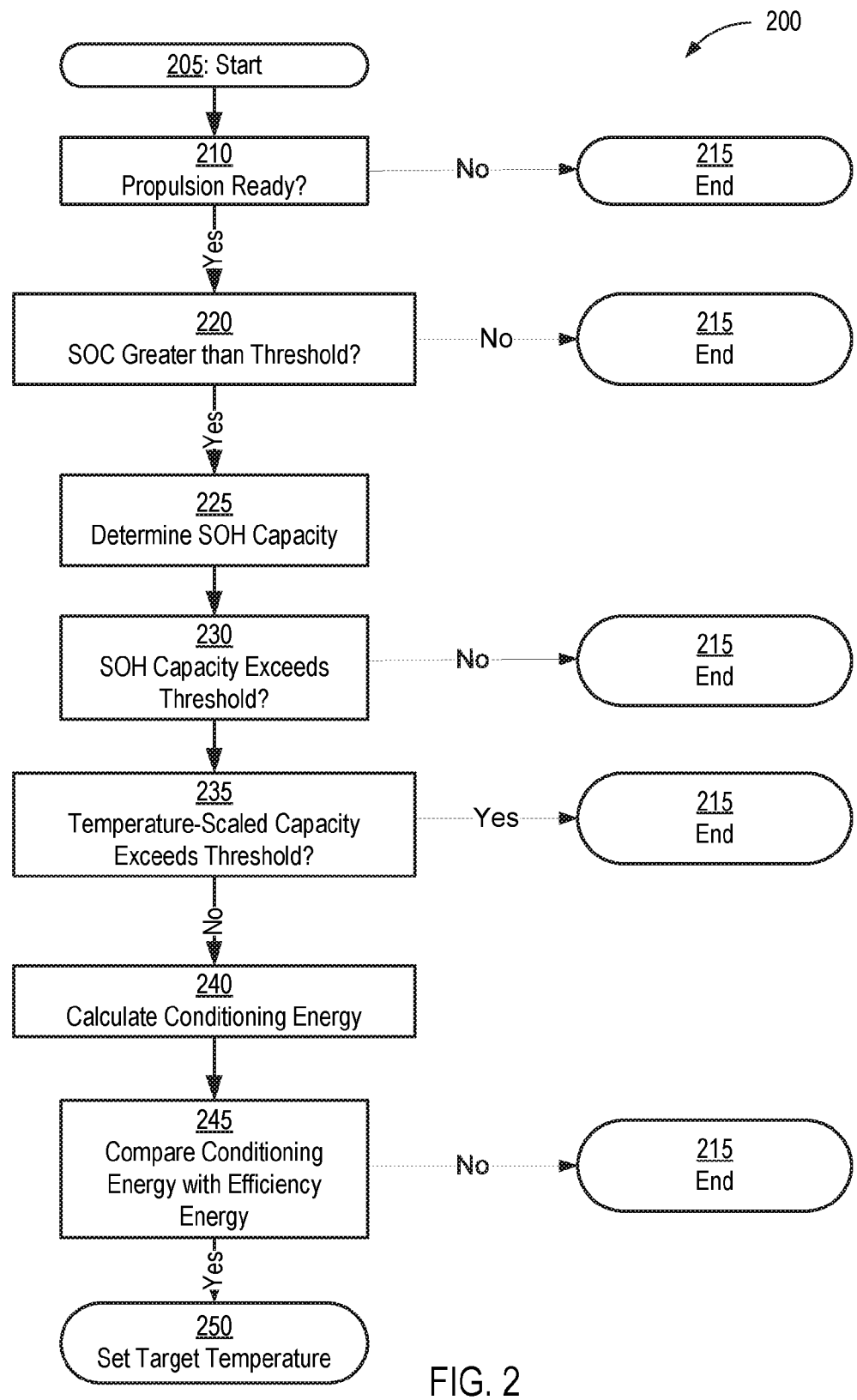
FIG. 2 illustrates a flow chart of one implementation of a method for determining a target temperature for a vehicle battery and for adjusting a vehicle battery temperature to improve vehicle efficiency.

FIG. 2 is a flow chart illustrating an example of one implementation of a method for determining a target temperature for a vehicle battery and for adjusting a vehicle battery temperature to improve vehicle efficiency. Method 200 begins at step 205. At step 210, a determination is made as to whether vehicle propulsion is ready. If not, then then method 200 ends at 215 with the target temperature being left as a default target temperature. In some implementations, a default target temperature need not be provided, in which case the process simply terminates at step 215 without setting a target temperature. If propulsion is ready, method 200 proceeds to step 220. Step 220 may comprise determining whether a battery state of charge, such as an RESS state of charge, is greater than a trip optimization threshold. In some embodiments and implementations, the trip optimization threshold may a state of charge of about 50%. If not, method 200 terminates at 215 without setting, or without resetting, a target temperature. If so, method 200 proceeds to step 225.

At step 225, the capacity of the battery or one or more sections of the battery is determined. In some implementations, step 225 may comprise use of state of health information. For example, in some implementations, a state of health scaled capacity of the battery or one or more sections of the battery may be determined. At step 230, a determination is made as to whether the capacity, such as the state of health-scaled capacity, exceeds a predetermined threshold. In some embodiments and implementations, the predetermined threshold may be about 70%. If not, method 200 may terminate at 215. If so, method 200 proceeds to step 235.

At step 235, a determination may be made as to whether a temperature-scaled capacity exceeds a predetermined threshold. In some embodiments and implementations, this predetermined threshold may comprise 90%. In connection with step 235, information from one or more temperature sensors may be used to determine a current, temperature-scaled capacity. If the predetermined threshold is exceeded, the process may terminate at step 215. If the predetermined threshold is not exceeded, the process may proceed to step 240.

Step 240 may comprise calculating a conditioning energy comprising an estimate of the energy needed to recondition the at least a portion of the battery to a target battery temperature. In some embodiments and implementations, the condition energy may be calculated using one or more of an ambient temperature, a current temperature of at least a portion of the battery, the target battery temperature, and a heat transfer coefficient associated with the battery system.

In some embodiments and implementations, step 240 may further comprise calculating an efficiency energy comprising an estimate of the energy savings attributable to operating the vehicle at the target battery temperature in comparison to operating the vehicle at the sensed temperature. The efficiency energy may be calculated using, for example, an estimated change in a battery capacity of at least a portion of the vehicle battery between the sensed battery temperature and the target battery temperature and/or a coefficient of performance associated with the vehicle and/or vehicle battery system.

At step 245, the conditioning energy may be compared with the efficiency energy. In some embodiments and implementations, upon determining that the efficiency energy exceeds the conditioning energy, the target battery temperature may be set at step 250. If the efficiency energy does not exceed the conditioning energy, the process may terminate at step 215 without setting, or without resetting, the target battery temperature. In some implementations, step 245 may comprise comparing the conditioning energy with the efficiency energy and, upon determining that a ratio of the efficiency energy to the conditioning energy exceeds a threshold ratio, setting the target battery temperature at step 250. In some implementations, the threshold ratio may be about 2/1. In some implementations, step 250 may further comprise reconditioning at least a portion of the vehicle battery to the target battery temperature. In some implementations, the target battery temperature may comprise a temperature range.

As another example, in some implementations and embodiments, a comparison may be made between the heat energy needed to increase a battery or battery section from a current temperature to a target temperature (which may comprise the conditioning energy) and the increase in battery capacity attributable to so increasing the battery temperature (which may comprise the efficiency energy). In some embodiments, it may be preferable that the ratio of these two quantities (heat energy needed/battery capacity gained) is less than a threshold amount (or greater than a threshold amount if the reciprocal ratio is considered). For example, in some implementations and embodiments, the threshold ratio may be about 0.5.

Some embodiments may further comprise a consideration of a coefficient of performance of a heating system for increasing the battery temperature. In such embodiments, the conditioning energy may comprise an amount of electrical energy needed to increase a battery or battery section from a current temperature to a target temperature.

In some embodiments, the electrical energy needed to increase a battery or battery section from a current temperature to a target temperature may be less than the heat energy needed to increase a battery or battery section from a current temperature to a target temperature. This may be due to use of heat energy from, for example, a vehicle engine, that may have otherwise been wasted. This may also be due to use of heat energy from the battery itself, which may also have been otherwise wasted. Some embodiments may therefore comprise consideration of a ratio of the electrical energy needed to increase a battery or battery section from a current temperature to a target temperature to the heat energy needed to increase a battery or battery section from a current temperature to a target temperature. Some embodiments may be configured such that this ratio is about 0.7.

Figure 3:
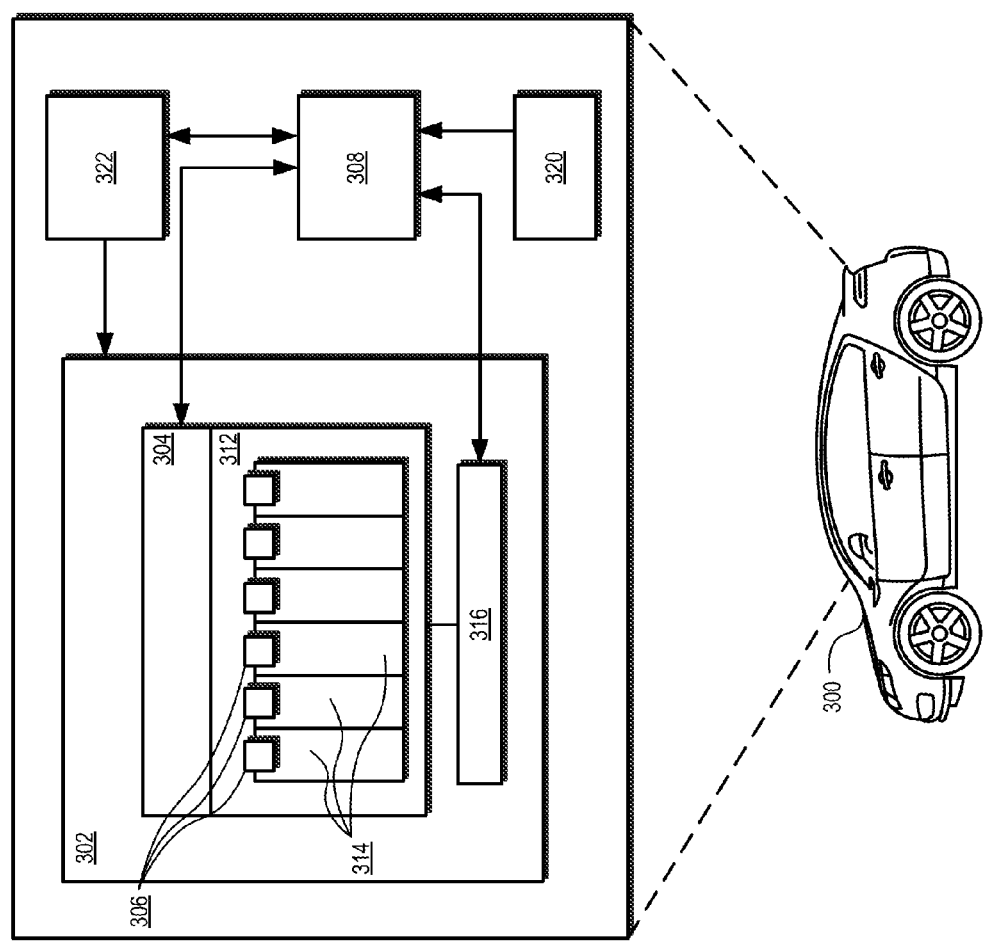
FIG. 3 illustrates an example of a system for determining a target temperature for a vehicle battery and/or adjusting a vehicle battery temperature.

FIG. 3 illustrates an example of a system for determining a target temperature for a vehicle battery and/or adjusting a vehicle battery temperature in a vehicle 300 in a consistent with embodiments disclosed herein. The vehicle 300 may be a motor vehicle, a marine vehicle, an aircraft, and/or any other type of vehicle, and may include an internal combustion engine ("ICE") drivetrain, an electric motor drivetrain, a hybrid engine drivetrain, a FC drivetrain, and/or any other type of drivetrain suitable for incorporating the systems and methods disclosed herein. The vehicle 300 may include a battery system 302. The battery system may be used to power electric drivetrain components (e.g., as in an electric, hybrid, or FC power system). In some embodiments, the battery system 302 may be configured to supply electric energy to a variety of vehicle 300 systems, including, for example, vehicle starter systems (e.g., a starter motor), lighting systems, ignition systems, and/or the like.

The battery system 302 may comprise battery electronics 304. The battery electronics 304 may be configured to monitor and control certain operations of the battery system 302. For example, the battery electronics 304 may be configured to monitor and control charging, discharging, and/or balancing operations of the battery system 302. In certain embodiments, the battery electronics 304 may be communicatively coupled with one or more sensors (e.g., sensors 306), actuation devices (e.g., electrical relays), and/or systems configured to enable the battery electronics 304 to monitor and control operations of the battery system 302.

The battery system 302 may include one or more battery packs 312 suitably sized and configured to provide electrical power to the vehicle 300. Each battery pack 312 may include one or more battery sections 314. The battery sections 314 may comprise one or more battery cells utilizing any suitable battery technology including, for example, lead-acid, nickel-metal hydride ("NiMH"), lithium-ion ("Li-Ion"), Li-Ion polymer, lithium-air, nickel-cadmium ("NiCad"), valve-regulated lead-acid ("VRLA") including absorbed glass mat ("AGM"), nickel-zinc ("NiZn"), molten salt (e.g., a ZEBRA battery), and/or other suitable battery technologies.

In some embodiments, one or more temperature sensors may also be provided. For example, in the embodiment depicted in FIG. 3, a temperature sensor 316 is provided that may be coupled to one or more of the battery packs 312. In some embodiments, one or more such temperature sensors 316 may be coupled directly to one or more of the various battery sections 314 of battery pack 312. Alternatively, in other embodiments a single temperature sensor 316 may be used that may be coupled to a single, particular location within battery system 302, such as a single battery section 314, in which case it may be assumed for purposes of the target temperature determination/setting that each of the other battery sections likely has a similar temperature.

The battery electronics 304 may further be configured to provide information to and/or receive information from other systems included in the vehicle 300. For example, the battery electronics 304 may be communicatively coupled with a battery conditioning system 308. In certain embodiments, the battery electronics 304 may be configured, at least in part, to provide information regarding the battery system 302 to a user of the vehicle 300 and/or battery conditioning system 308. Such information may include, for example, battery state of charge information, battery operating time information or other battery health information, battery operating temperature information received from one or more temperature sensors 316, and/or any other information regarding the battery system 302.

Some embodiments may further comprise an ambient temperature sensor 320. Ambient temperature sensor may be configured to provide information regarding ambient temperatures to battery conditioning system 308. Ambient temperature sensor 308 may be located at any suitable position within or on vehicle 300. In some embodiments ambient temperature sensor may be part of battery system 302. In other embodiments, ambient temperature sensor may be part of another vehicle system and may be communicatively coupled with battery conditioning system 308 as, for example, part of a retrofitting operation.

As described above, battery conditioning system 308 may be configured to calculate a temperature-scaled battery capacity of at least a portion of the battery system 302, such as battery pack 312, at a sensed temperature and to compare the temperature-scaled battery capacity with a capacity threshold. Upon determining that the temperature-scaled battery capacity is below the capacity threshold, the battery conditioning system 308 may be configured to determine a target battery temperature for the at least a portion of the battery system 302.

One or more sensors, such as sensors 306, may be used to obtain data used to determine a state of health of the vehicle battery. The battery conditioning system 308 may be configured to use the state of health of the vehicle battery to calculate the temperature-scaled battery capacity. The battery conditioning system 308 may be further configured to calculate a conditioning energy comprising an estimate of the energy needed to recondition the at least a portion of the vehicle battery to the target battery temperature.

In some embodiments, the battery conditioning system 308 may be configured to calculate the conditioning energy using one or more of an ambient temperature from ambient temperature sensor 320, a current temperature of at least a portion of the vehicle battery system 302 sensed from the battery temperature sensor 316, and the target battery temperature. The battery conditioning system 308 may be further configured to calculate an efficiency energy comprising an estimate of the energy savings attributable to operating the vehicle 300 at the target battery temperature in comparison to operating the vehicle at the sensed temperature. The efficiency energy may be calculated using one or more of an estimated change in a battery capacity of one or more batteries and/or battery sections of vehicle battery system 302 between the sensed battery temperature and the target battery temperature.

In some embodiments, the battery conditioning system 308 may be further configured to compare the conditioning energy with the efficiency energy and, upon determining that the efficiency energy exceeds the conditioning energy, set the target battery temperature to recondition the at least a portion of the vehicle battery to the target battery temperature. In some embodiments, the battery conditioning system 308 may be configured to compare the conditioning energy with the efficiency energy and, upon determining that a ratio of the efficiency energy to the conditioning energy exceeds a threshold ratio, set the target battery temperature to recondition the at least a portion of the vehicle battery to the target battery temperature.

Some embodiments may further comprise a battery heating system 322 communicatively coupled with the battery conditioning system 308 and/or battery system 302. Battery heating system 322 may be configured to modify a temperature of at least a portion of the vehicle battery system 302. In some embodiments, the battery heating system 322 may comprise a heat transfer fluid, a pump configured to pump the heat transfer fluid through the vehicle battery system, and/or a heater configured to heat the heat transfer fluid.

Battery heating system 322 may comprise a heat transfer fluid loop and a heat transfer fluid pump that is configured to pump the heat transfer fluid through the loop to alter the temperature of one or more portions of battery system 302. In some embodiments, battery heating system 322 may be controllable to vary the flow rate of the heat transfer fluid flowing through the heat transfer fluid loop. In some embodiments, the heat transfer fluid flowing through the battery system 302 may be used to heat and/or cool the battery system 302 as needed to condition one or more portions of the battery system 302 according to, for example, the target battery temperature determined by the battery conditioning system 308.

The foregoing specification has been described with reference to various embodiments. However, one of ordinary skill in the art will appreciate that various modifications and changes can be made without departing from the scope of the present disclosure. For example, various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

Those having skill in the art will appreciate that many changes may be made to the details of the above-described embodiments without departing from the underlying principles of the invention. The scope of the present invention should, therefore, be determined only by the following claims.

The invention claimed is:

1. A system for modifying a vehicle battery temperature, comprising:
a vehicle battery system comprising at least one vehicle battery, the vehicle battery comprising a plurality of battery sections;
a battery temperature sensor configured to sense a temperature of at least a portion of the vehicle;
a battery conditioning system configured to receive information from the battery temperature sensor and modify a temperature of at least one section of the plurality of battery sections of the vehicle battery system,
wherein the battery conditioning system is configured to separately calculate a temperature-scaled battery capacity of a first section of the plurality of battery sections and a second section of the plurality of battery sections using one or more temperatures measured by the battery temperature sensor,
wherein the battery conditioning system is configured to compare the temperature-scaled battery capacity of the first section with a first capacity threshold,
wherein the battery conditioning system is further configured to compare the temperature-scaled battery capacity of the second section with a second capacity threshold, wherein the first capacity threshold differs from the second capacity threshold, and
wherein the battery conditioning system is configured to, upon determining that the temperature-scaled battery capacity of at least one of the first section and the second section is below the capacity threshold, determine a target battery temperature for at least one of the first section and the second section of the plurality of battery sections of the vehicle battery system.

2. The system of claim 1, further comprising at least one sensor communicatively coupled to the battery conditioning system, wherein the at least one sensor is configured to obtain data used to determine a state of health of the vehicle battery, and wherein the battery conditioning system is configured to use the state of health of the vehicle battery to calculate the temperature-scaled battery capacities of the first and second sections.

3. The system of claim 1, wherein the battery conditioning system is further configured to calculate a conditioning energy comprising an estimate of the energy needed to recondition at least a portion of the vehicle battery to the target battery temperature.

4. The system of claim 3, further comprising an ambient temperature sensor configured to sense an ambient temperature associated with the vehicle, wherein the temperature sensor is configured to sense a temperature of at least a portion of the vehicle battery, wherein the battery conditioning system is configured to calculate the conditioning energy using at least the ambient temperature, a current temperature of at least a portion of the vehicle battery system sensed from the battery temperature sensor, and the target battery temperature.

5. The system of claim 3, wherein the battery conditioning system is further configured to calculate an efficiency energy comprising an estimate of the energy savings attributable to operating the vehicle at the target battery temperature in comparison to operating the vehicle at the sensed temperature.

6. The system of claim 5, wherein the battery conditioning system is configured to calculate the efficiency energy using at least an estimated change in a battery capacity of at least one of the first section and the second section of the vehicle battery between the sensed battery temperature and the target battery temperature.

7. The system of claim 5, wherein the battery conditioning system is further configured to compare the conditioning energy with the efficiency energy and, upon determining that the efficiency energy exceeds the conditioning energy, set the target battery temperature to recondition at least a portion of the vehicle battery to the target battery temperature.

8. The system of claim 7, wherein the battery conditioning system is configured to compare the conditioning energy with the efficiency energy and, upon determining that a ratio of the efficiency energy to the conditioning energy exceeds a threshold ratio, set the target battery temperature to recondition at least a portion of the vehicle battery to the target battery temperature.

9. The system of claim 1, further comprising a battery heating system communicatively coupled with the battery conditioning system and configured to modify a temperature of at least a portion of the vehicle battery.

10. The system of claim 9, wherein the battery heating system comprises:
 a heat transfer fluid;
 a pump configured to pump the heat transfer fluid through the vehicle battery system; and
 a heater configured to heat the heat transfer fluid.

* * * * *